US010503611B1

(12) United States Patent
Srivastav et al.

(10) Patent No.: US 10,503,611 B1
(45) Date of Patent: Dec. 10, 2019

(54) DATA PROTECTION MANAGEMENT FOR DISTRIBUTED STORAGE

(71) Applicant: EMC IP Holding Company LLC, Hopkins, MA (US)

(72) Inventors: Shashwat Srivastav, Seattle, WA (US); Mikhail Danilov, Saint-Petersburg (RU); Sriram Sankaran, Redmond, WA (US); Jun Luo, Bellevue, WA (US); Subba R. Gaddamadugu, Westborough, MA (US); Peter M. Musial, Arlington, MA (US); Andrew D. Robertson, Washington, DC (US); Chen Wang, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 288 days.

(21) Appl. No.: 15/390,415

(22) Filed: Dec. 23, 2016

(51) Int. Cl.
*G06F 11/14* (2006.01)
*G06F 3/06* (2006.01)
(Continued)

(52) U.S. Cl.
CPC ......... *G06F 11/1469* (2013.01); *G06F 3/064* (2013.01); *G06F 3/065* (2013.01); *G06F 3/067* (2013.01); *G06F 3/0619* (2013.01); *G06F 11/1076* (2013.01); *G06F 11/1451* (2013.01); *G06F 11/1464* (2013.01);
(Continued)

(58) Field of Classification Search
CPC .... G06F 11/1076; G06F 3/067; G06F 3/0619; G06F 3/064
See application file for complete search history.

(56) References Cited

U.S. PATENT DOCUMENTS

2014/0380125 A1* 12/2014 Calder ............... G06F 11/10 714/766
2014/0380126 A1* 12/2014 Yekhanin ........... G06F 11/10 714/766

(Continued)

*Primary Examiner* — Jigar P Patel
(74) *Attorney, Agent, or Firm* — Womble Bond Dickinson (US) LLP

(57) ABSTRACT

An efficient and scalable method of managing data protection in a geographically distributed storage system is provided using erasure coding. Each zone in the geographically distributed storage system of multiple zones or clusters encodes primary backup chunks replicated from original data chunks in remote zones to create coding chunks. The zone retains one of the coding chunks and distributes the remaining coding chunks to remote zones for future recovery from dual and more complex failures. Upon completion, the primary backup chunks and peer backup chunks can safely be deleted to reduce overhead. Encoding k primary backup chunks to create m coding chunks, and distributing the m coding chunks to different remote zones assures recovery from 1 to m zone/cluster/chunk failures. After 1 to m zone failures the unaffected zones are each able to recover all of the unavailable chunks by retrieving from each other any of the unaffected zone's distributed coding chunks and still available original data chunks, and restoring the content of the unavailable chunks by decoding the combination of the retained coding chunk, distributed coding chunk, and any still available original data chunks.

19 Claims, 14 Drawing Sheets

(51) Int. Cl.
 *G06F 11/10* (2006.01)
 *H03M 13/15* (2006.01)
(52) U.S. Cl.
 CPC ..... *H03M 13/154* (2013.01); *G06F 2201/805* (2013.01); *G06F 2201/82* (2013.01)

(56) References Cited

U.S. PATENT DOCUMENTS

| | | | |
|---|---|---|---|
| 2016/0246677 A1* | 8/2016 | Sangamkar | G06F 11/1076 |
| 2016/0380650 A1* | 12/2016 | Calder | G06F 11/1076 |
| | | | 714/766 |
| 2017/0097875 A1* | 4/2017 | Jess | G06F 11/2069 |

* cited by examiner

700 – ERASURE CODED FRAGMENTS IN AN EXEMPLARY 12+4 ERASURE CODED CHUNK

DATA PROTECTION MANAGEMENT FOR DISTRIBUTED STORAGE

CROSS REFERENCE TO RELATED APPLICATION

This Application is related to U.S. patent application Ser. No. 14/319,383 filed on Jun. 30, 2014, entitled "DATA BACKUP MANAGEMENT ON DISTRIBUTED STORAGE SYSTEMS," the content and teachings of which application is incorporated herein by reference in its entirety.

TECHNICAL FIELD

Embodiments of the present invention relate generally to data storage systems. More particularly, embodiments of the invention relate to data protection management for distributed storage systems.

BACKGROUND

In data storage systems space is allocated for storing a primary set of user data. Additional storage space is allocated for providing data protection for the primary set of data. For example, data protection can include mirroring to generate a backup copy of the primary data. The backup copy provides protection against data loss in the event of primary data failure.

In geographically distributed data storage systems, data protection can include replication to generate copies of primary and backup data and stored independently to provide additional protection.

The amount of additional storage space needed for data protection varies over time. Allocating too much or too little risks data loss, inefficient storage utilization and/or an increase in the cost of storage. Because providing data protection can be costly in terms of storage capacity and processing requirements, large-scale data protection for distributed data storage systems requires complex software architecture and development to achieve outstanding availability, capacity use efficiency, and performance.

The Dell EMC® Elastic Cloud Storage (ECS™) distributed data storage solutions employ data protection methodologies that minimize capacity overhead while providing robust data protection. Among other innovations, rather than relying on a conventional file system, ECS™ partitions disk space into a set of blocks of fixed size called chunks to help manage disk capacity, ranging in size from 64 MB to 128 MB. All user data is stored in these chunks and the chunks are shared in that one chunk may (and, in most cases, does) contain fragments of several user objects. Chunk content is modified in append-only mode. When a chunk becomes full enough, the chunk is sealed. The content of sealed chunks is immutable.

Storing user data in chunks allows the use of other techniques to minimize capacity overhead while providing robust data protection. For example, for geographically distributed storage, ECS™ provides additional protection of user data with geo-replication, also referred to as GEO data protection, in which replication is performed at the chunk level and geographically distributed. Among other techniques, to minimize the storage capacity overhead associated with GEO data protection, ECS™ uses an exclusive or (XOR) operation to reduce the impact of replicating chunks.

Notwithstanding the advancements achieved using ECS™ data protection for geographically distributed storage, large cloud-scale data storage systems continue to present new challenges, including reducing the capacity overhead associated with data protection and improving the ability to recover from complex failures of storage infrastructure.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
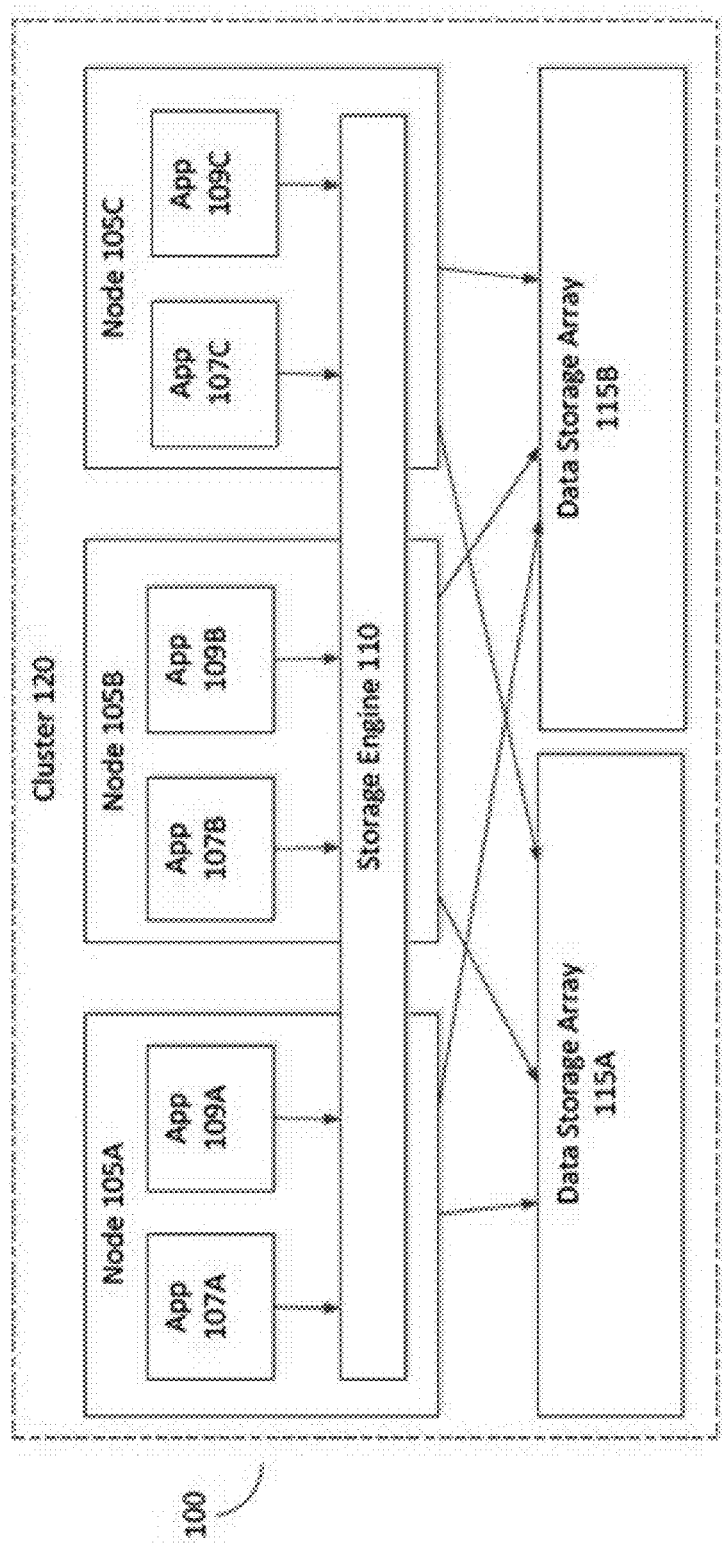
FIG. 1 is a block diagram illustrating an overview of an operating environment of a data protection management system according to one embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

As already noted, storing user data in chunks allows the use of other techniques to minimize capacity overhead while providing robust data protection, such as the technique of using the exclusive or (XOR) operation to reduce the impact of replicating chunks for data protection. Unfortunately, XOR operations cannot recover data lost from a dual failure or from more complicated failures.

As distributed cloud storage systems grow in size, consisting of dozens (or hundreds) of zones and clusters, the need to recover from complex failures will be even more severe because the statistical probability of a dual, triple and m zone failures increases as the number of zones increases within a single distributed storage (cloud).

To address the challenges of reducing the capacity overhead associated with data protection while improving the ability to recover from complex failures of storage infrastructure, embodiments of the systems, apparatuses and methods herein described provide an efficient and scalable method of managing data protection in a distributed storage system using erasure coding.

In one embodiment, instead of relying on XOR operations to protect data in geographically distributed storage systems, erasure coding is used to protect replicated chunk data efficiently while reducing the storage capacity overhead associated with replication. In this manner, erasure coding enhances data protection scalability in large distributed storage systems, such as cloud-based storage systems, that comprise a plurality of zones/clusters.

By way of explanation, as will be described in greater detail with reference to FIGS. 7-8, erasure coding encodes data that has been divided into k data fragments of equal size to create m redundant coding fragments. The encoding assures that the loss of any up to any m fragments of the k+m fragments can be tolerated. To recover lost fragments erasure coding decodes the available data fragments and coding fragments.

In the same way that erasure coding is used to encode and decode data fragments of equal size to create redundant coding fragments that assure against data loss, the described embodiments of managing data protection in distributed storage use erasure coding to encode and decode data chunks of equal size to create redundant coding chunks to assure against data loss. Like data fragments, the data chunks are also of equal size because chunk size is fixed, using padding or other data complement as needed to maintain the fixed size. As with data fragments, erasure coding encodes data chunks to assure that the loss of any up to any m chunks of the k+m data and/or coding chunks can be tolerated. To recover lost chunks erasure coding decodes the available data chunks and coding chunks.

In view of the foregoing, in one embodiment, an erasure coding scheme is used to create redundant m coding chunks from k chunks of protected data, resulting in k+m chunks in total. Distributing the chunks to different nodes/zones/clusters in a distributed data storage system, assures that the distributed data protection system can tolerate the loss of any m chunks as will be described in further detail in the description that follows.

In one embodiment, each zone in a distributed storage system of multiple zones or clusters prepares for recovery from dual and complex failures using erasure coding. Each zone receiving primary backup chunks replicated from original data chunks on remote zones prepares for such recovery by encoding the primary backup chunks to create coding chunks.

In one embodiment, a local zone performing the encoding retains one of the coding chunks and distributes the remaining coding chunks that it created to remote zones for recovery from any future dual and/or more complex failures of the distributed storage system.

In one embodiment, upon completion of the encoding and distribution of the coding chunks to remote zones, the primary backup chunks and any peer backup chunks can safely be deleted from all the zones of the distributed storage to reduce storage capacity overhead.

In one embodiment, encoding k primary backup chunks to create m coding chunks, and distributing m−1 coding chunks to different remote zones while retaining one coding chunk assures recovery from 1 to m zone/cluster/chunk failures. For example, after 1 to m zone failures the unaffected zones are each able to recover all of the unavailable chunks by retrieving from each other any of the unaffected zone's still available coding chunks and any still available original data chunks, and then restoring the content of the unavailable chunks by decoding the combination of the still available coding chunks, and any of the still available original data chunks.

In one embodiment, the chunks of data can be a specified size, e.g. 64 MB/128 MB. In one embodiment, the chunks of data belong to a set of blocks of data stored in a partitioned disk space. In one embodiment, the chunks of data include data in any one or more file and object storage formats.

In one embodiment, the ultimate per chunk capacity overheads for managing data protection using erasure coding can be calculated using the formula in EQ. 1 as follows:

$$o = m/k * \text{chunk\_size} \quad \text{[EQ. 1]}$$

where o represents the calculated per chunk capacity overhead. For instance, if 10+2 scheme is used, the per chunk capacity overhead is just 0.2 of a chunk size.

In one embodiment, after from 1 to m failures, recovery of all of the unavailable chunks is carried out as follows. For each unavailable chunk, an erasure coding decoding function is performed on a group of still available original data chunks and coding chunks including the retained coding chunk of the zone/cluster performing the recovery. In one embodiment, the recovery process is driven by a zone that did not create the coding chunks but has at least one related coding chunk that was distributed to it during the encoding process. In one embodiment, the resulting data created by performing the erasure coding decoding function is the missing/unavailable chunk. When the number of zones in a distributed storage is greater or equal to k+m and all the data and coding chunks are stored to different zones, the distributed storage is assured of recovering from any m zone/cluster/chunk failures.

In one embodiment, the distributed data storage system includes a geographically distributed data storage system, including a cloud-based storage system, composed of geographically distributed zones and/or clusters. A zone and/or cluster can include one or more compute nodes and one or more data storage arrays.

In one embodiment, data protection management using erasure coding enables the creation of redundant backups while minimizing use of data storage space within a distributed data storage system. In one embodiment, the data protection management using erasure coding enables a distributed data storage system to recover data from failure of one or more portions of the distributed data storage system. In other embodiments, data protection management using erasure coding enables a distributed data storage system to recover data from a failure of one or more nodes/clusters/zones in the distributed data storage system.

In one embodiment, data protection management using erasure coding enables a distributed data storage system to recover data from a failure of a zone and/or cluster in a distributed data storage system. In one embodiment, a zone and/or cluster can communicate with one or more zones and/or clusters in the distributed data storage systems. In one embodiment, a zone and/or cluster can manage and/or store data in chunk format.

In one embodiment, a compute node in a distributed data storage system can include a storage engine. In some embodiments, a storage engine enables communication between one or more compute nodes in a distributed data storage system. In one embodiment, a storage engine enables a distributed data storage system to conduct cluster-wide and/or zone-wide activities, such as creating backups and/or redundancies in a zone. In other embodiments, a storage engine enables a distributed data storage system to conduct system-wide activities that can enable creation of redundancies and/or backups to handle failure of one or more zones and/or clusters while maintaining data integrity across the entire system. In one embodiment, a zone and a cluster can equate to the same constructs in a distributed data storage system.

In one embodiment, a storage engine may include one or more layers. In one embodiment, layers within a storage engine may include a transaction layer, index layer, chunk management layer, storage server management layer, partitions record layer, and/or a storage server (Chunk I/O) layer. In one embodiment, a transaction layer parses received object requests from applications within a distributed data storage system. In one embodiment, a transaction layer can read and/or write object data to the distributed data storage system.

In one embodiment, an index layer can map file-name/data-range to data stored within the distributed data storage system. In various embodiments, an index layer may be enabled to manage secondary indices used to manage data stored on the distributed data storage system.

In one embodiment, a chunk management layer may manage chunk information, such as, but not limited to, location and/or management of chunk metadata. In one embodiment a chunk management layer can execute per chunk operations. In one embodiment, a storage server management layer monitors the storage server and associated disks. In one embodiment, a storage server management layer detects hardware failures and notifies other management services of failures within the distributed data storage system.

In one embodiment, a partitions record layer records an owner node of a partition of a distributed data storage system. In one embodiment, a partitions record layer records metadata of partitions, which may be in a B+tree and journal format. In one embodiment, a storage server layer directs I/O operations to one or more data storage arrays within the distributed data storage system.

In one embodiment, a zone may be enabled to create efficient backups for other zones in a distributed data storage system. In one embodiment, a zone encodes backups from multiple zones to create coded backups that allow the recovery of the space used to store the backups from which the coded backups were created. For example, in one embodiment, an erasure coding operation encodes two or more backups into coding backups. In one embodiment, once coded backups have been created and distributed to other locations, a distributed data storage system may remove the coded backups to reduce storage capacity overhead.

FIG. 1 illustrates an exemplary distributed data storage system in accordance with an embodiment of data protection management using erasure coding. As shown, distributed data storage system 100 includes Cluster 120, Nodes (105A-C, 105 generally), and Data Storage Arrays (115A-B, 115 Generally). Node 105A is in communication with Data Storage Array 115A and Data storage Array 115B. Node 105B is in communication with Data Storage Array 115A and 115B. Node 105C is in communication with Data Storage Array 115A and Data storage Array 115B.

In one embodiment, storage engine 110 is executed on each node 105. In one embodiment, storage engine 110 enables Applications 107A, 109A, 107B, 109B, 107C, 109C to execute data I/O requests to and from distributed data storage system 100. In various embodiments, a distributed data storage system may include one or more clusters that may be located in one or more locations.

FIGS. 2A-2E are block diagrams illustrating an example of managing data protection with erasure coding according an embodiment of the invention. FIGS. 3A-3C are block diagrams illustrating an example of recovering from a failure with data protection managed using erasure coding, including reconstructing the unavailable data after the failure. In the FIGS. 2A-2E and 3A-3C, and by way of example only, there are six zones and a requirement for the distributed storage to recover data from two failures of zones and/or clusters and/or chunks.

Figure 2A:
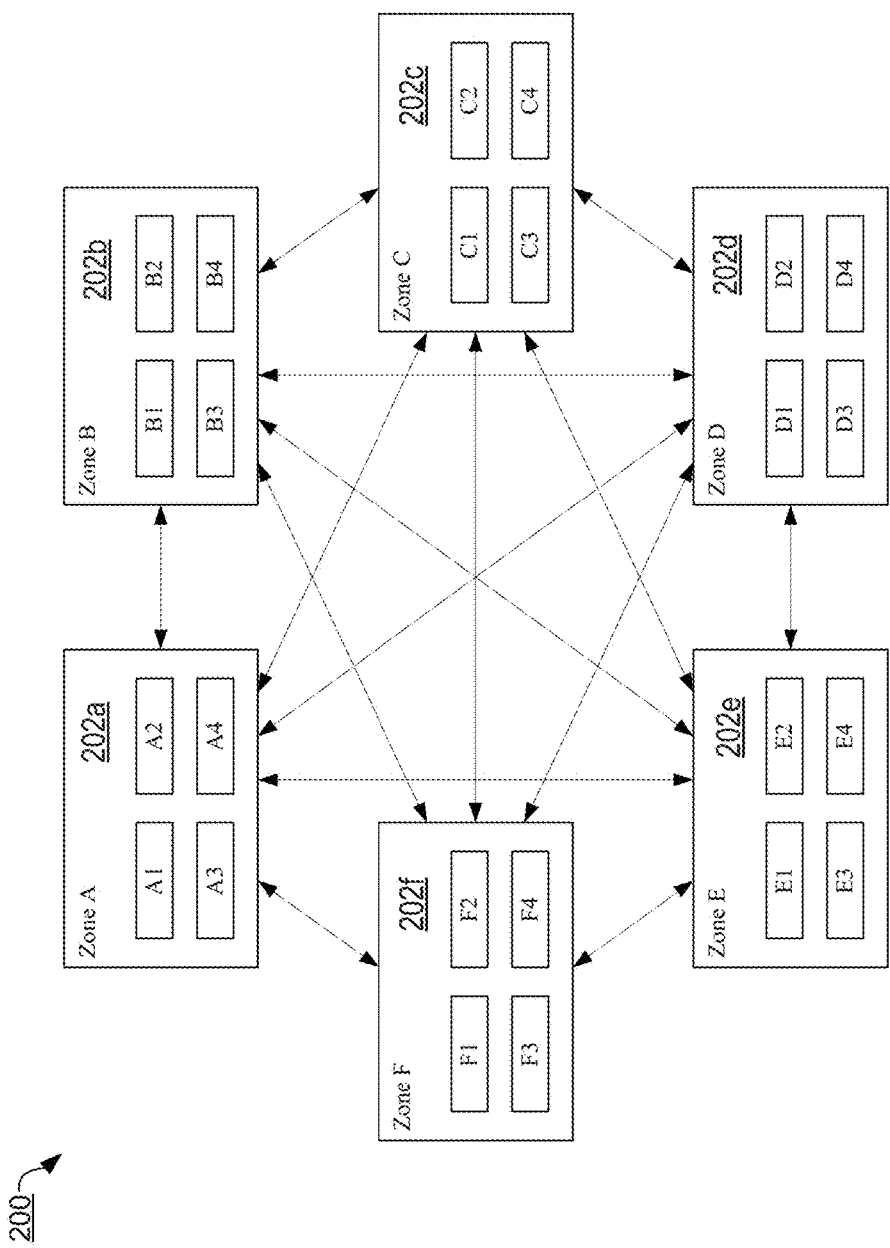
FIGS. 2A-2E are block diagrams illustrating exemplary data protection backup with erasure coding according to one embodiment of the invention.
Figure 3A:
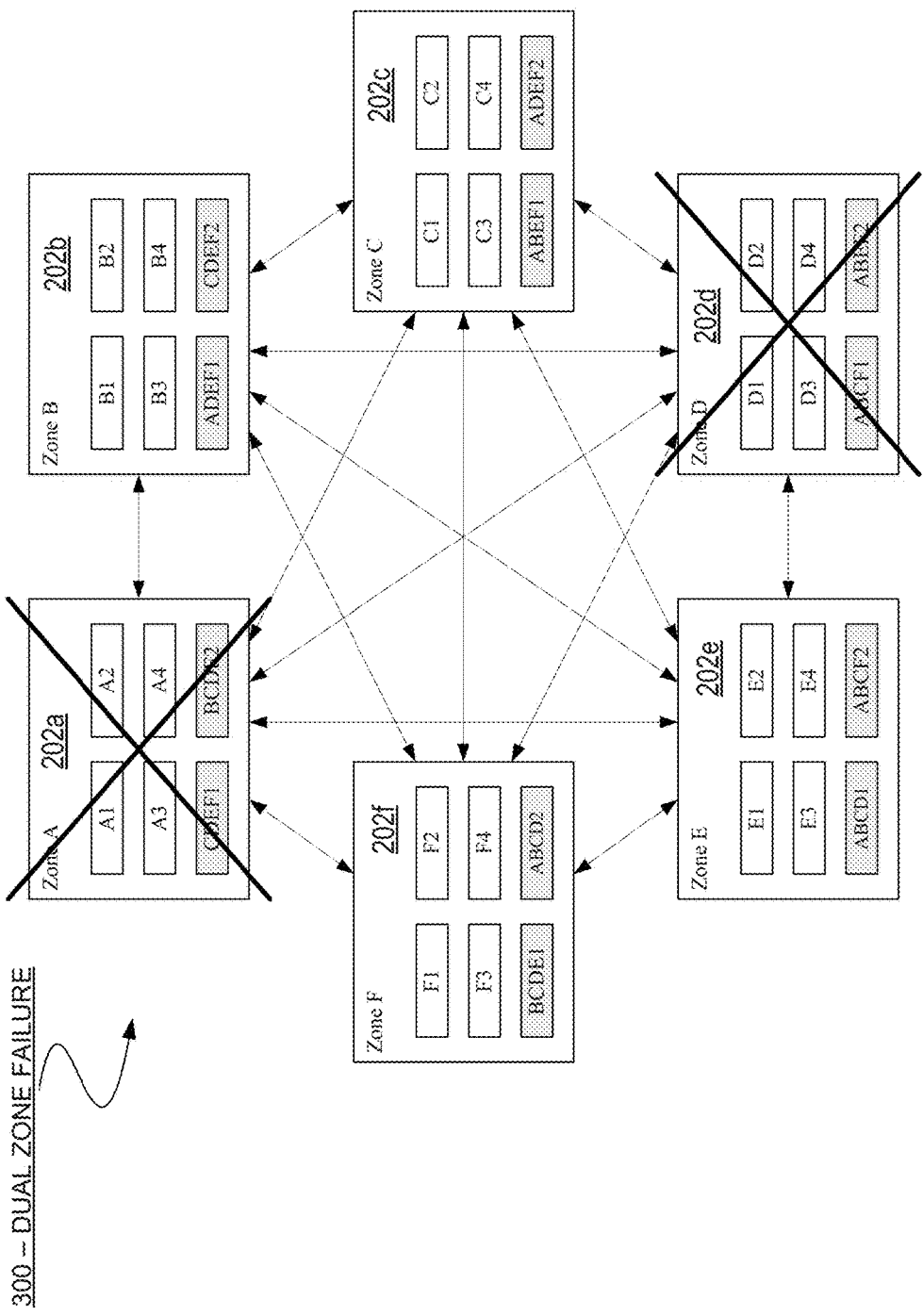
FIGS. 3A-3C are block diagrams illustrating exemplary data protection recovery with erasure coding according to one embodiment of the invention.
Figure 3B:
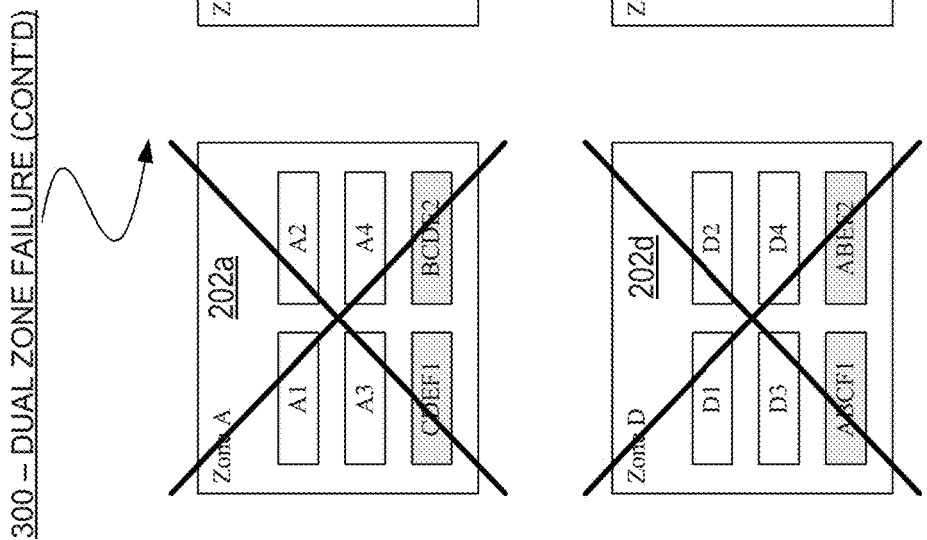
Figure 3C:
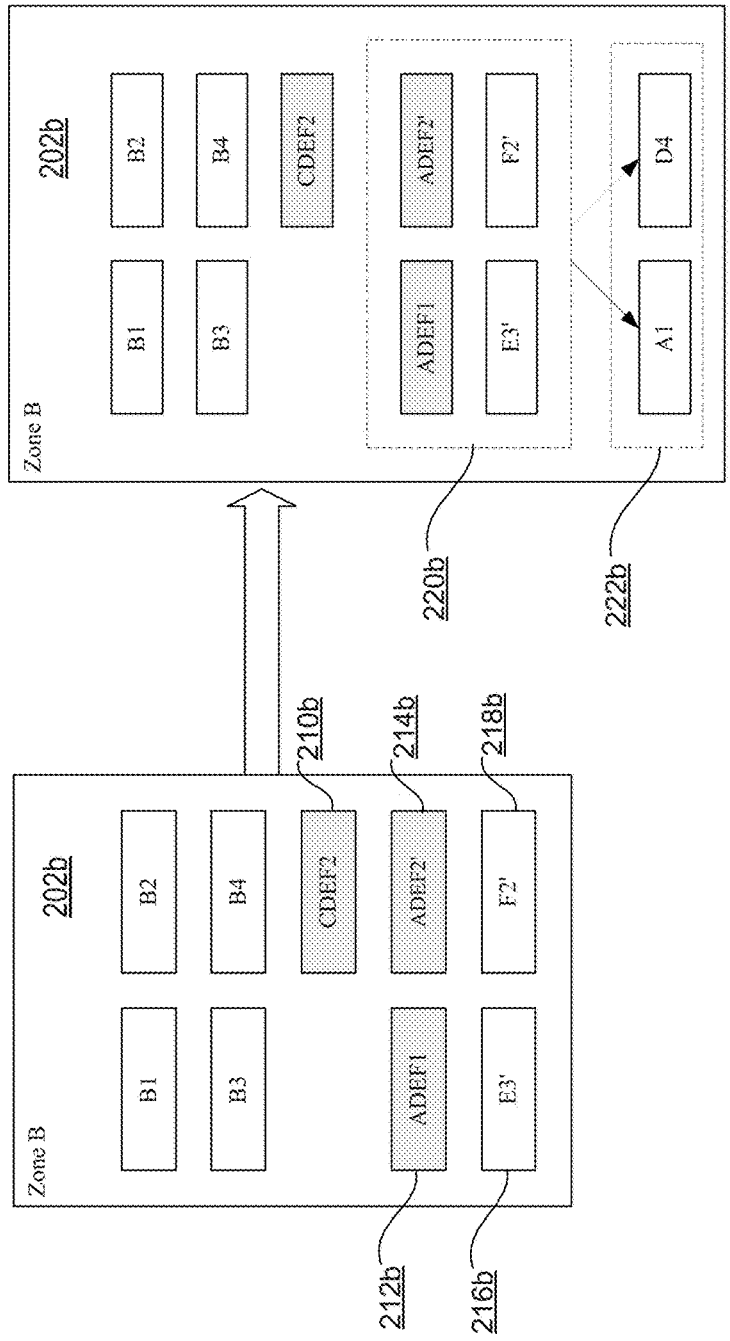

In FIG. 2A, in a configuration of a distributed data storage system 200 having six zones, Zone A 202a, Zone B 202b, Zone C 202c, Zone D 202d, Zone E 202e and Zone F 202f, all of the zones communicate with each other. Each zone contains four chunks of data, Zone A containing A1, A2, A3, A4, Zone B containing B1, B2, B3, B4, and so forth.

Figure 2B:
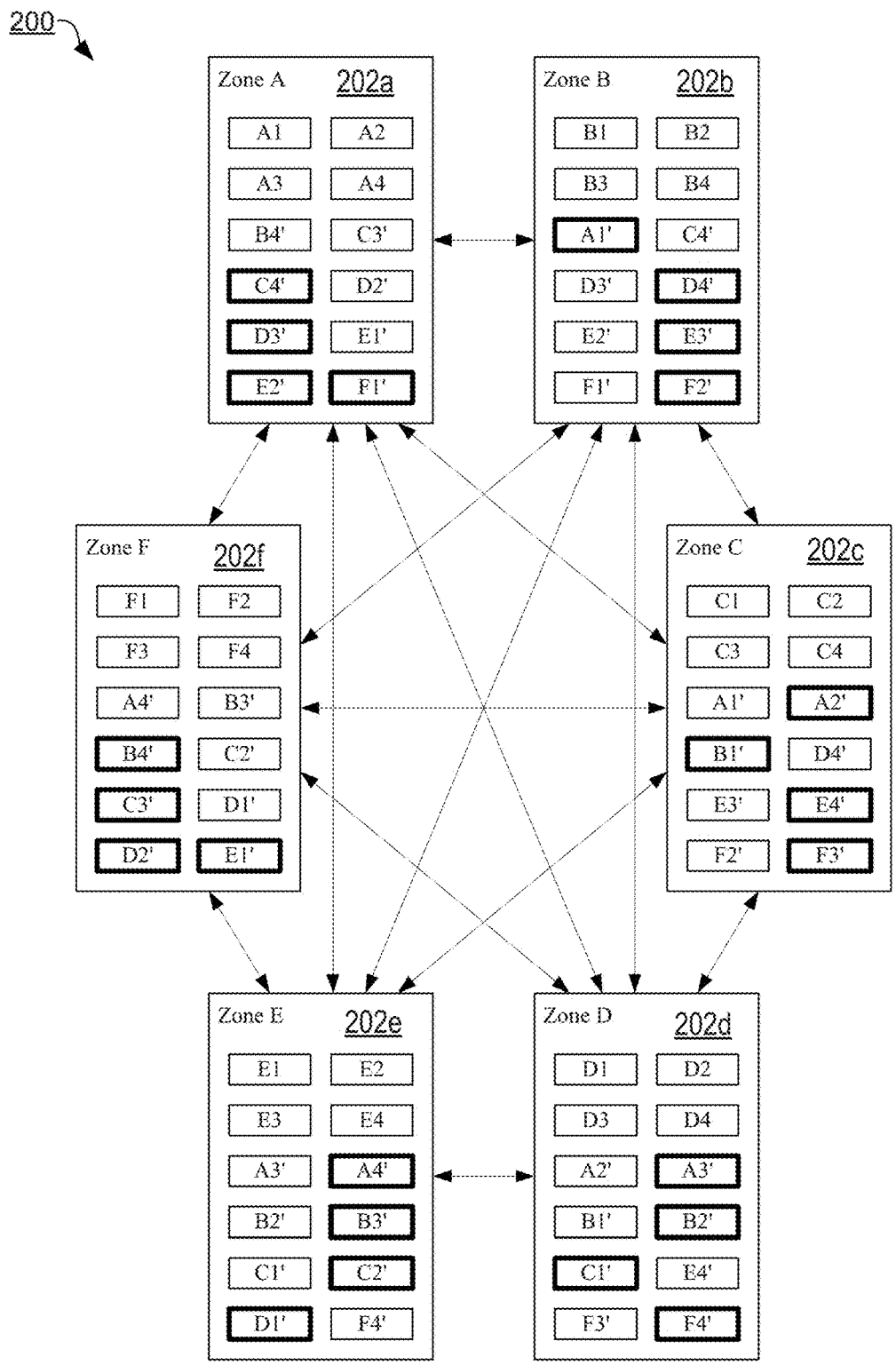

In FIG. 2B, as illustrated, each of the six zones protects its data chunks by creating two backup copies at remote zones, i.e. replicating its data chunks at remote zones. For example, Zone A 202a creates two backup copies A1' of data chunk A1 at remote zones, Zone B 202b and Zone C 202c. In so doing, each zone tries to replicate its data chunks to the maximal number of remote zones, in this case five remote zones in the figure above. For instance, Zone A replicates its chunk A1 to Zone B and Zone C; chunk A2 to Zone C and Zone D; chunk A3 to Zone D and Zone E; and chunk A4 to Zone E and Zone F. As illustrated in FIG. 2B, the primary backup copy of each data chunk is drawn with a bold line. The backup copy of each data chunk that is not the primary backup copy is referred to as a peer backup.

With reference to FIG. 2B, as can be seen from the marked increase in the number of data chunks now contained in each of the six zones, geographical data protection using replication triples the chunk capacity footprint within a distributed storage.

In one embodiment, to reduce capacity overhead resulting from geographical data protection using replication, each zone in the distributed storage system 200 manages data protection using erasure coding to create coding chunks from its resident primary backup copies. In the example embodiment, and by way of example only, a k+m erasure coding scheme is used, where k=4 and m=2, to encode k primary backup chunks into m coding chunks, i.e. encode 4 primary backup chunks to create 2 coding chunks. Other schemes can be employed, e.g. 12+4, depending on the number of primary backup chunks and peer data chunks that need to be protected.

Figure 2C:
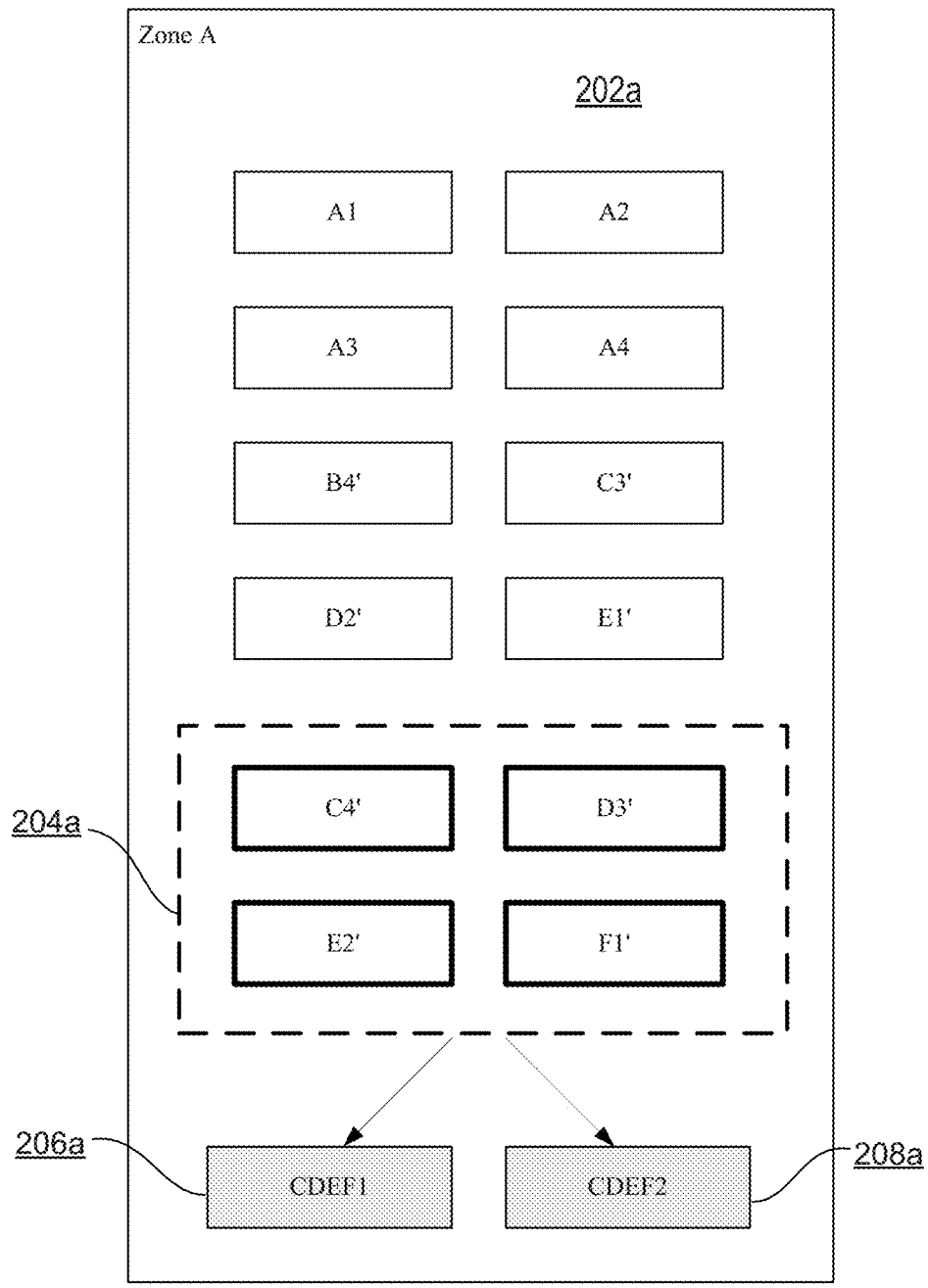
Figure 2D:
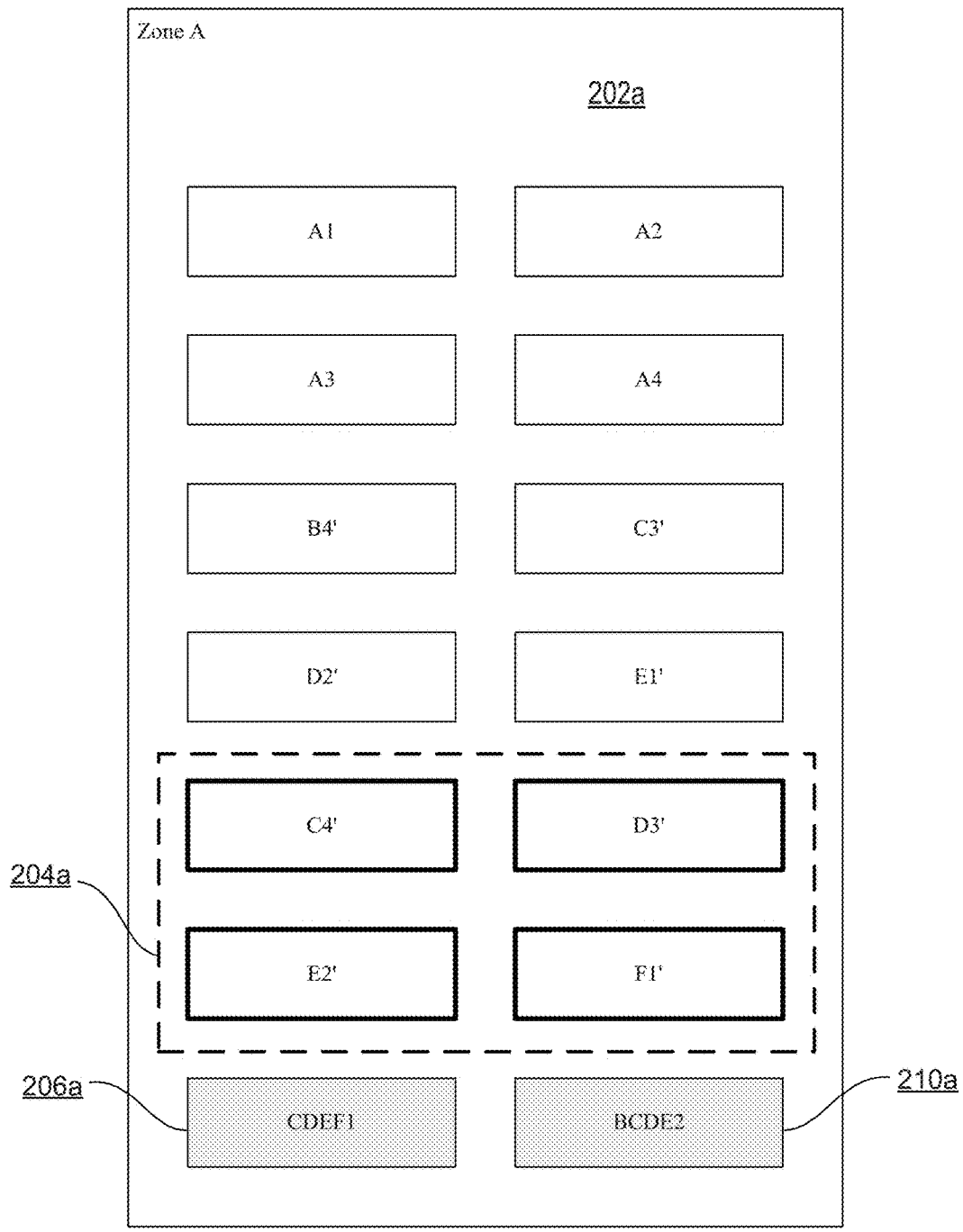

For example, as illustrated in FIG. 2C, Zone A 202a stores four primary backup chunks 204a that belong to different remote zones, (C4', D3', E2', and F1'). In one embodiment, Zone A encodes the four primary backup chunks 204a (C4', D3', E2', and F1') to create two coding chunks CDEF1 206a and CDEF2 208a. Each of the other five zones, Zone B 202b, Zone C 202c, Zone D 202d, Zone E 202e and Zone F 202f encodes its own primary backup chunks similarly (not illustrated). During encoding, only the primary backup chunks 204a are encoded; the other peer backups (the ones that are not outlined in bold) are not included in the encoding process.

To assure the ability to recover from a future failure in the distributed storage system, in one embodiment, each zone retains just one of the coding chunks that it created and distributes the rest of its coding chunks to remote zones. For example, with reference to FIG. 2D, in Zone A 202a, first coding chunk CDEF1 206a stays in Zone A where it was created, whereas the second coding chunk (CDEF2 208a, not shown in FIG. 2D) is moved to another zone, such as in a clockwise direction to Zone B 202b (see, for example, FIG. 2E). As a result of moving coding chunks to different zones, in the illustrated example in FIG. 2D, Zone A 202a now contains coding chunk BCDE2 210a originating from Zone F 202F and moved clockwise to Zone A 202a.

Figure 2E:
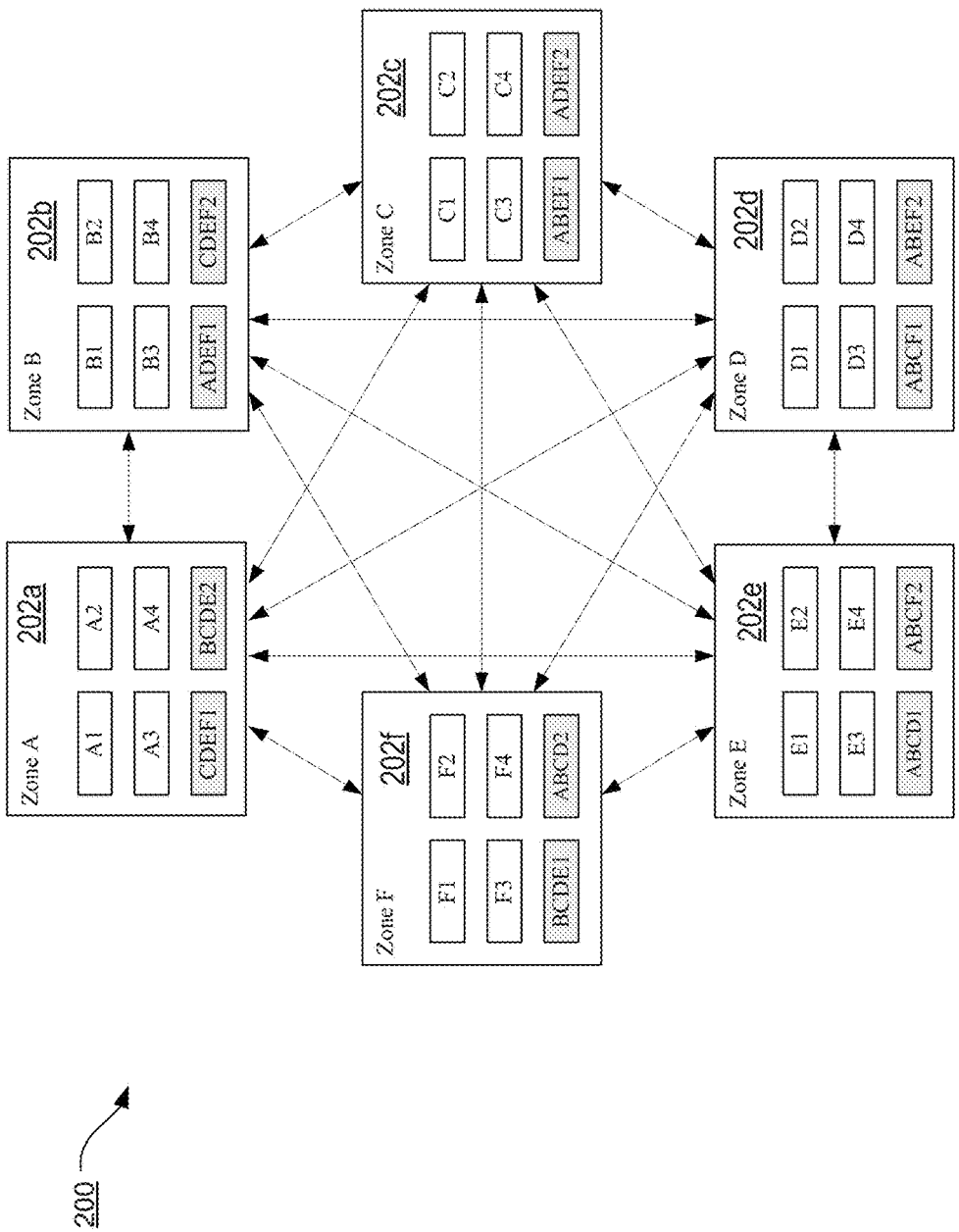

With reference to FIG. 2E, in one embodiment, once all of the zones have each created its own set of coding chunks, each zone proceeds to delete all of the backup chunks, both (local) primary and (remote) peer backup chunks, as they are no longer needed for protection. In the illustrated example, each zone stores its chunks and two coding chunks yielding a reduction in the capacity overhead associated with replication by a factor of four, e.g. two coding chunks in each zone instead of eight (primary and peer) backup chunks. In this manner, the use of erasure coding to manage data protection allows the distributed storage zones to reduce capacity overhead.

In one embodiment, should any of the primary data chunks that the deleted backup chunks were protecting become unavailable, e.g. due to a failure of the zone containing the primary data chunks, the data can be recovered using erasure coding as will be explained in further detail in FIGS. 3A-3C.

For example, FIG. 3A illustrates a dual zone failure 300 in which Zone A 202a and Zone D 202d are no longer active. Such failures can be caused by any number of reasons such as a data center power failure, communication failure, and the like. However caused, the failure triggers the distributed storage system 200 to initiate recovery of data from the dual failure of zones and/or clusters and/or chunks. The illustrated dual zone failure 300 is by way of example only; other permutations of zone/cluster/chunk failures can trigger recovery in the same manner as the illustrated dual zone failure.

As illustrated in FIG. 3B, once the active zones, Zone B 202b, Zone C 202c, Zone E 202e and Zone F 202f realize the failures of Zone A 202a and Zone D 202d are permanent, they stop attempts to communicate with the failed zones and begin recovery of primary data chunks the failed zones used to own, in this example, data chunks A1-A4 and D1-D4.

By way of example only, FIG. 3C illustrates the recovery, by Zone B 202b, of the unavailable primary data chunks A1 and D4 due to the failure of zones Zone A 202a and Zone D 202d. As shown, to initiate recovery, Zone B 202b uses the local coding chunk ADEF1 212b that it previously created and retained (but does not use the distributed coding chunk CDEF2 210b that it received from Zone A 202a). Zone B 202b further retrieves a copy of the still available coding chunk ADEF2' 214b that it previously replicated to a neighboring zone, Zone C 202c. Zone B 202b further retrieves still available data chunks E3' 216b and F2' 218b that it originally used to produce the coding chunks ADEF1 212b and ADEF2 now retrieved into Zone B as ADEF2' 214b. The three other available zones, Zone C 202c, Zone E 202e, Zone F 202f, similarly initiate recovery.

In the illustrated embodiment of FIG. 3C, Zone B 202b uses its local coding chunk ADEF1 212b, retrieved coding chunk ADEF2', and retrieved copies of data chunks E3 and F2 as a group 220b to restore the content of missing chunks A1 and D4 222b via the erasure coding decoding function. The three other available zones, Zone C 202c, Zone E 202e, Zone F 202f, similarly restore the content of the other missing chunks A2, A3, A4, D1, D2 and D3. Upon completion of the recovery all of the missing chunks from Zone A and Zone D, A1, A2, A3, A4, D1, D2, D3, and D4 will have been restored in this manner.

Figure 4:
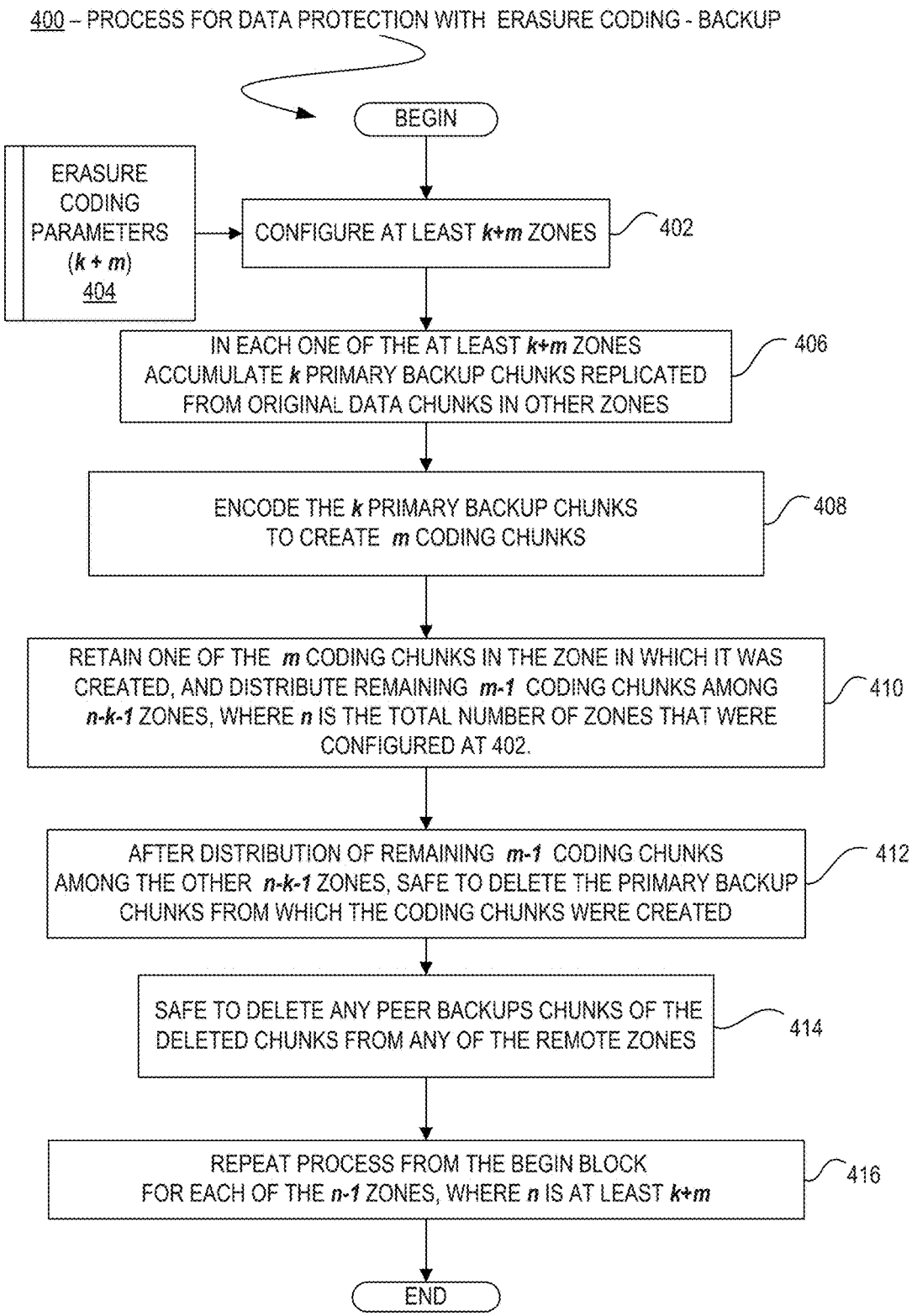
FIG. 4 is a flow diagram illustrating processes for data protection backup with erasure coding according to one embodiment of the invention.
Figure 5:
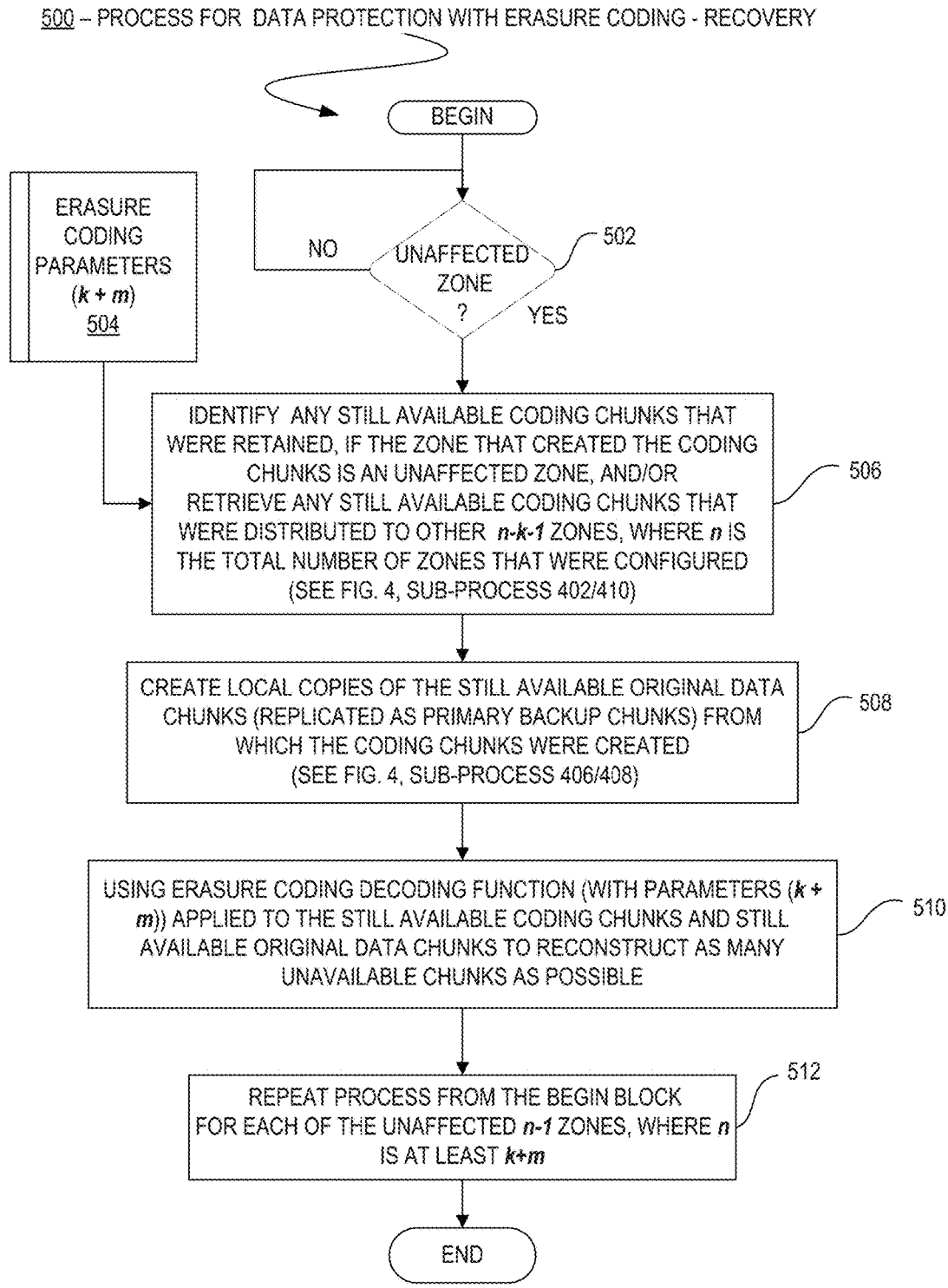
FIG. 5 is a flow diagram illustrating processes for data protection recovery with erasure coding according to one embodiment of the invention.

FIGS. 4 and 5 describe the logic of the processes depicted in the examples of the foregoing FIGS. 2A-2E and FIGS. 3A-3C. In FIG. 4, a process 400 for managing data protection using erasure coding begins at 402, in which a distributed data protection system is configured into at least k+m zones in accordance with protection parameters, including erasure coding parameters k+m 404 for the erasure coding encoding function.

At 406, each zone that was configured to manage data protection using erasure coding in accordance with an embodiment of the invention, i.e. the at least k+m zones, proceeds to accumulate k chunks of primary backup data from other zones. In one embodiment, at 408 process 400 encodes the accumulated k chunks of primary backup data and creates m coding chunks. At 410 process 400 continues by retaining one of the m coding chunks that it created and distributing the remaining m−1 coding chunks among n−k−1 zones, where n is the total number of zones that were configured at 402.

In one embodiment, at 412, the zone deletes the primary backup chunks from which the coding chunks were created as they are no longer needed. The retained coding chunk and m−1 coding chunks distributed among the n−k−1 zones provide sufficient protection should recovery of the original data chunks be needed. At 414, to further reduce the storage overhead capacity associated with data protection, the zone further deletes any peer backup chunks of the deleted primary backup chunks from remote zones. At 416, the process 400 is repeated for any other n−1 zones, where n is at least k+m zones in the distributed data storage system that are configured to manage data protection using erasure coding.

In FIG. 5, a process 500 for data protection with erasure coding recovery begins at 502, in which a distributed data protection system, previously configured into at least k+m zones in accordance with protection parameters, including erasure coding parameters k+m 504 for the erasure coding encoding function, responds to a failure(s) in the distributed data protection system by determining which zones are unaffected and which zones have failed.

In one embodiment, at 506, the process 500, for each unaffected zone, retrieves any of the still available m−1 coding chunks that the zone previously distributed to other zones, and obtains the coding chunk that the zone earlier retained. In one embodiment, at 506, if the zone that performed the encoding and distribution of the m coding chunks is one of the affected zones and no longer available (in which case the retained coding chunk is no longer available) then process 500 is driven by an unaffected zone to which one or more of the m−1 coding chunks were distributed. At 508, the process 500, for each unaffected zone, creates local copies of the still available original data chunks (related to the primary backup chunks) from which the coding chunks were created.

Finally, in one embodiment, at 510, the process 500, for each unaffected zone, uses erasure coding decoding function to reconstruct as many unavailable chunks as possible. At 512, the recovery process 500 is repeated for any other of the zones unaffected by the zone(s) failures.

Figure 6:
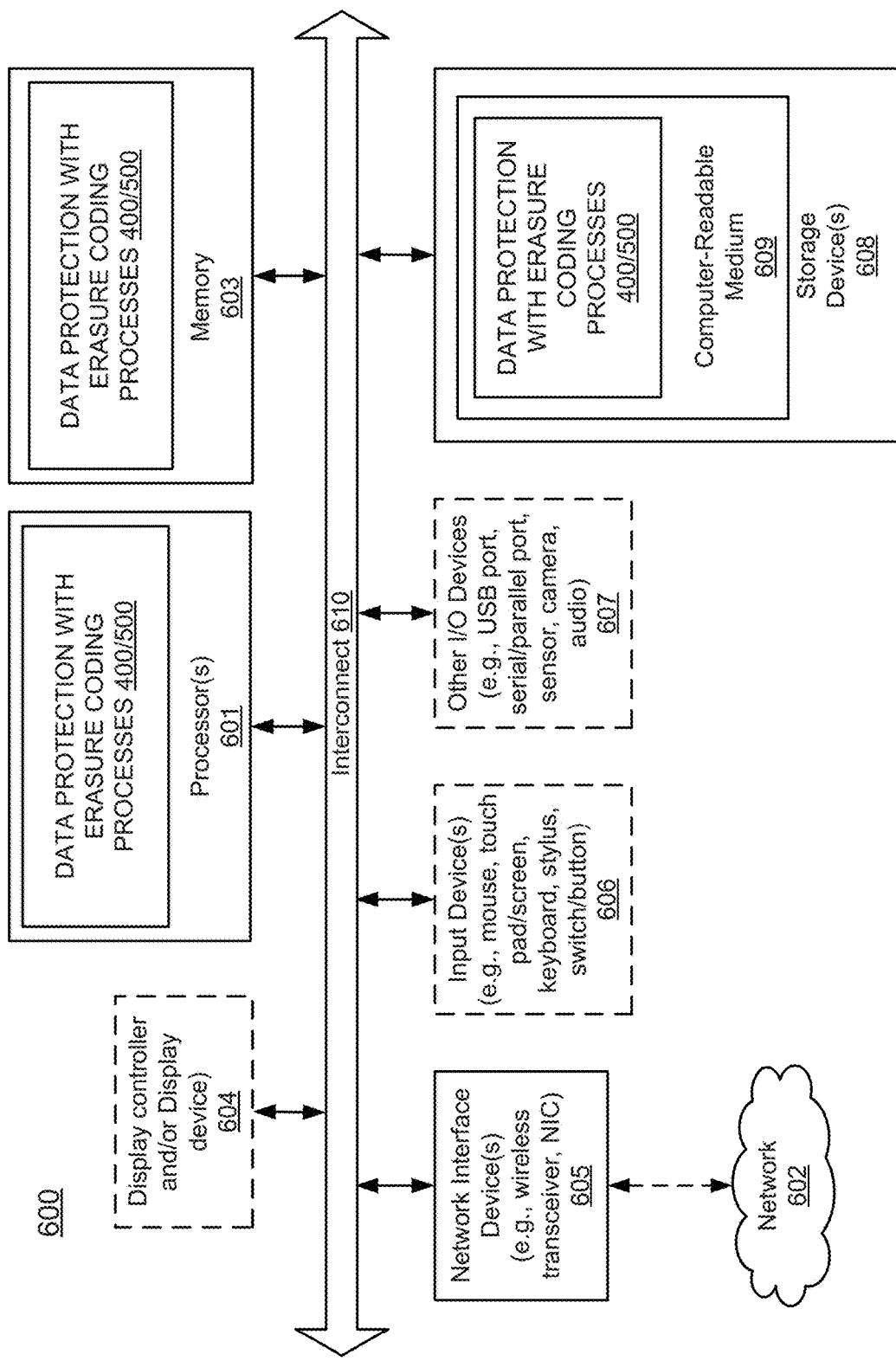
FIG. 6 is a block diagram illustrating a general overview of a data processing system environment for providing a data protection management system according to one embodiment of the invention.

FIG. 6 is a block diagram illustrating an example of a data processing system 600 that may be used with one embodiment of the invention. For example, system 600 represents any of data processing systems described above performing any of the processes or methods described above. System 600 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 600 is intended to show a high level view of many components of the computer system. However, it is to be understood that additional components may be present in certain implementations and furthermore, different arrangement of the components shown may occur in other implementations. System 600 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 600 includes processor 601, memory 603, and devices 605-608 via a bus or an interconnect 610. Processor 601 may represent a single processor or multiple processors with a single processor core or multiple processor cores included therein. Processor 601 may represent one or more general-purpose processors such as a microprocessor, a central processing unit (CPU), or the like. More particularly, processor 601 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 601 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 601, which may be a low power multi-core processor socket such as an ultra-low voltage processor, may act as a main processing unit and central hub for communication with the various components of the system. Such processor can be implemented as a system on chip (SoC). Processor 601 is configured to execute instructions for performing the operations and steps discussed herein. System 600 may further include a graphics interface that communicates with optional graphics subsystem 604, which may include a display controller, a graphics processor, and/or a display device.

Processor 601 may communicate with memory 603, which in one embodiment can be implemented via multiple memory devices to provide for a given amount of system memory. Memory 603 may include one or more volatile storage (or memory) devices such as random access memory (RAM), dynamic RAM (DRAM), synchronous DRAM (SDRAM), static RAM (SRAM), or other types of storage devices. Memory 603 may store information including sequences of instructions that are executed by processor 601, or any other device. For example, executable code and/or data of a variety of operating systems, device drivers, firmware (e.g., input output basic system or BIOS), and/or applications can be loaded in memory 603 and executed by processor 601. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 600 may further include IO devices such as devices 605-608, including network interface device(s) 605, optional input device(s) 606, and other optional IO device(s) 607. Network interface device 605 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 606 may include a mouse, a touch pad, a touch sensitive screen (which may be integrated with display device 604), a pointer device such as a stylus, and/or a keyboard (e.g., physical keyboard or a virtual keyboard displayed as part of a touch sensitive screen). For example, input device 606 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 607 may include an audio device. An audio device may include a speaker and/or a microphone to facilitate voice-enabled functions, such as voice recognition, voice replication, digital recording, and/or telephony functions. Other IO devices 607 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO devices 607 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 610 via a sensor hub (not shown), while other devices such as a keyboard or thermal sensor may be controlled by an embedded controller (not shown), dependent upon the specific configuration or design of system 600.

To provide for persistent storage of information such as data, applications, one or more operating systems and so forth, a mass storage (not shown) may also couple to processor 601. In various embodiments, to enable a thinner and lighter system design as well as to improve system responsiveness, this mass storage may be implemented via a solid state device (SSD). However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 601, e.g., via a serial peripheral interface (SPI). This flash device may provide for non-volatile storage of system software, including a basic input/output software (BIOS) as well as other firmware of the system.

Storage device 608 may include computer-accessible storage medium 609 (also known as a machine-readable storage medium or a computer-readable medium) on which is stored one or more sets of instructions or software (e.g., module, unit, and/or logic of any of the components of data protection processes 400/500 and/or storage system 100) embodying any one or more of the methodologies or functions described herein. Module/unit/logic 400/500 may also reside, completely or at least partially, within memory 603 and/or within processor 601 during execution thereof by data processing system 600, memory 603 and processor 601 also constituting machine-accessible storage media. Module/unit/logic 400/500 may further be transmitted or received over a network 602 via network interface device 605.

Computer-readable storage medium 609 may also be used to store the some software functionalities described above persistently. While computer-readable storage medium 609 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media, or any other non-transitory machine-readable medium.

Module/unit/logic of the storage system and data protection system components and other features described herein can be implemented as discrete hardware components or integrated in the functionality of hardware components such as ASICS, FPGAs, DSPs or similar devices. In addition, module/unit/logic 400/500 can be implemented as firmware or functional circuitry within hardware devices. Further, module/unit/logic 400/500 can be implemented in any combination hardware devices and software components.

Note that while system 600 is illustrated with various components of a data processing system, it is not intended to represent any particular architecture or manner of interconnecting the components; as such details are not germane to embodiments of the present invention. It will also be appreciated that network computers, handheld computers, mobile phones, servers, and/or other data processing systems that have fewer components or perhaps more components may also be used with embodiments of the invention.

Figure 7:
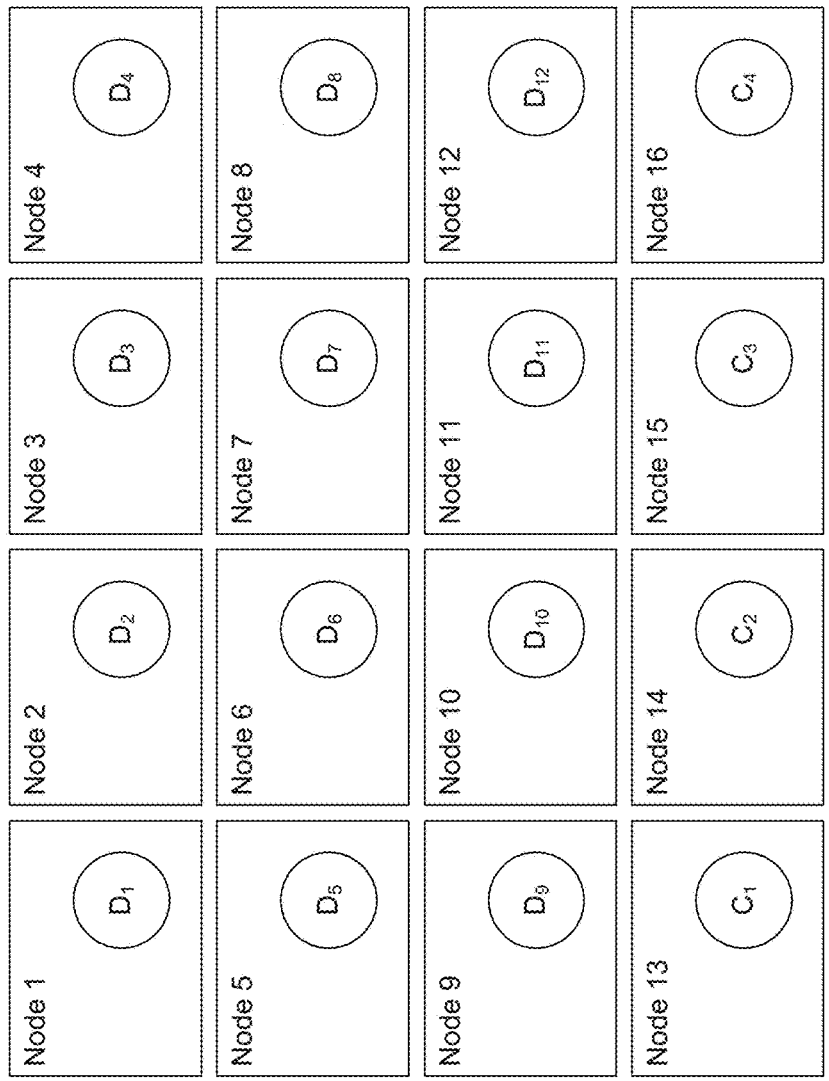
FIG. 7 is a block diagram illustrating exemplary erasure coded data used in providing a data protection management system according to one embodiment of the invention.

FIG. 7 is a block diagram illustrating exemplary erasure coded data 700 in one possible data layout for providing a data protection system according to one embodiment of the invention. As illustrated a piece of data (D), such as a chunk of protected data, is divided into k data fragments. During erasure encoding redundant m coding fragments are created.

The erasure coding is performed to assure that the distributed data protection system can tolerate the loss of any m fragments. In one embodiment, the erasure coding parameter k+m is 12+4, i.e. k equals to 12 and m equals to 4. In this case, there are 16 nodes and 16 fragments to be stored (12+4=16).

In one embodiment, each node of a data storage system such as the one illustrated in FIG. 1, contains just one fragment. A cluster may have fewer nodes, and one node can contain several fragments.

In one embodiment, the data protection embodiments described herein implement a variant of matrix-based Reed-Solomon erasure coding. FIG. 8 is a block diagram illustrating one such exemplary matrix-based erasure coding 800 for k+m=12+4 fragments, and used in providing a data protection system according to one embodiment of the invention.

Figure 8:
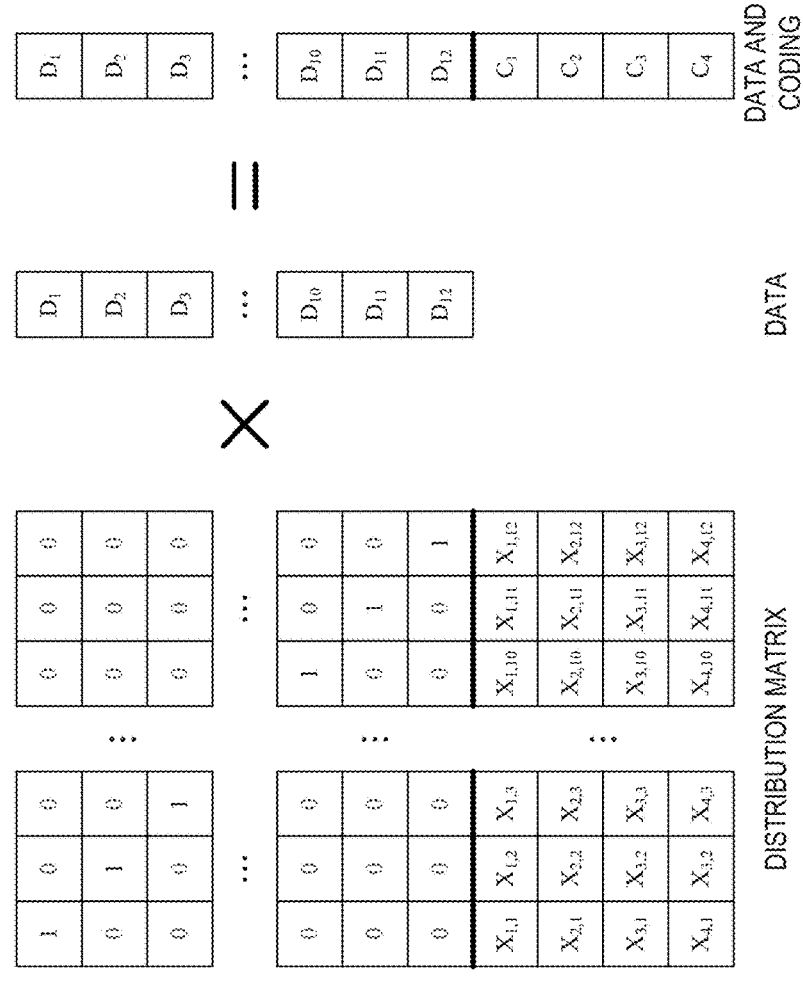
FIG. 8 is a block diagram illustrating exemplary matrix-based erasure coding used in providing a data protection management system according to one embodiment of the invention.

In the illustrated embodiment in FIG. 8, the k+m data and coding fragments (12+4) are a matrix-vector product, where the vector consists of k (12) data fragments and the matrix is a distribution matrix of (k+m)×k size. The first k rows of the distribution matrix compile a k×k identity matrix. The bottom m rows of the distributed matrix form the coding matrix. Coefficients $X_{i,j}$ are defined in a variety of ways depending on erasure coding algorithm used.

In one embodiment, during encoding, the distribution matrix is multiplied by a vector and produces a product vector containing both the data and the coding fragments. When some fragments are lost, the fragments are restored using a decoding matrix.

In one embodiment, the illustrated erasure coding scheme is the Reed-Solomon erasure coding scheme based on Galois Field (GF) arithmetic. In a typical embodiment, Galois fields with field's order $2^w$, where w is usually 4, 8, or 16. For such fields an ADD operation can be implemented using a single XOR operation.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A computer-executable method of managing data protection in a distributed storage system, the method comprising:
    configuring a distributed storage system into a plurality of at least k+m zones in which each zone accumulates k equal-sized primary backup chunks and one or more peer backup chunks of original data chunks replicated from different remote zones; and
    preparing the distributed storage system for recovery from a failure of 1 to m zones of the plurality of the at least k+m zones by performing the operations of:
        encoding, at each zone of the plurality of at least k+m zones, the k equal-sized primary backup chunks to create m equalized-sized redundant coding chunks using an erasure coding such that the distributed storage system has at least k+m chunks of data,
        retaining one of the m coding chunks in that zone of the plurality of at least k+m zones,
        distributing each of the remaining m−1 coding chunks to a different one of the remaining m−1 zones, and
        deleting each of k equal-sized primary backup chunks and the one or more peer backup chunks in that zone of plurality of at least k+m zones to reduce storage overhead.

2. The method of claim 1, further comprising:
    recovering unavailable chunks from a failure of 1 to m zones including performing, in each of the zones unaffected by the failure, any one or more of:
        identifying any of still available coding chunks created and retained by the zone, and
        retrieving any of the still available coding chunks distributed to the zone from another zone, and
        creating local copies of any of the still available original data chunks from which the still available coding chunks were created; and
        reconstructing as many unavailable chunks as possible from the still available coding chunks and the still available original data chunks.

3. The method of claim 1, wherein the plurality of at least k+m zones into which the distributed storage system is configured is distributed across a geographical area.

4. The method of claim 1, wherein the distributed storage system is a cloud-based storage system accessible over an inter-network.

5. The method of claim 1, wherein each of the m coding chunks are equal-sized and belong to a set of blocks of data stored in a partitioned disk space.

6. The method of claim 1, wherein an index layer maps one or more file-names to data stored within the distributed data storage system, and wherein the index layer is to manage secondary indices used to manage the data stored on the distributed data storage system.

7. A distributed storage system comprising:
    a cluster of nodes in communication with one or more data storage arrays and a storage engine, each node having a processor configured to execute an application, the storage engine enabling the application to process data I/O requests to and from the one or more data storage arrays, the processor further configured to:
    configure the cluster of nodes into a plurality of k+m zones in which each zone manages data stored in the one or more data storage arrays, the data including k equal-sized primary backup chunks and one or more peer backup chunks of original data chunks replicated from different remote zones; and
    prepare the cluster of nodes for recovery from a failure of any one or more zones in the plurality of zones, including causing each zone in the plurality of zones to:
        encode the equal-sized primary backup chunks to create m coding chunks using erasure coding such that the distributed storage system has at least k+m chunks of data,
        retain one of the m coding chunks in the zone,
        distribute each of the other m−1 coding chunks not retained to different zones in the plurality of zones, and
        delete any primary backup chunks and any peer backup chunks from the zone to reduce storage overhead.

8. The distributed storage system of claim 7, the processor further configured to:
    detect the failure of the any one or more zones in the plurality of zones;
    recover from the failure, including causing an unaffected zone unaffected by the failure to:
    retrieve from other unaffected zones any of the still available coding chunks;
    create local copies of any of still available original data chunks from which the coding chunks were created; and
    reconstruct any unavailable chunks from the still available coding chunks and the still available original data chunks.

9. The distributed storage system of claim 7, wherein the plurality of zones into which the cluster of nodes is configured is distributed across a geographical area.

10. The distributed storage system of claim 7, wherein the plurality of zones into which the cluster of nodes is configured is a cloud-based storage system accessible over an inter-network.

11. The distributed storage system of claim 7, wherein the erasure coding used to encode the primary backup chunks into coding chunks is bit matrix erasure coding.

12. The system of claim 7, wherein each of the m coding chunks are equal-sized and belong to a set of blocks of data stored in a partitioned disk space.

13. The system of claim 7, wherein an index layer maps one or more file-names to data stored within the distributed data storage system, and wherein the index layer is to manage secondary indices used to manage the data stored on the distributed data storage system.

14. A non-transitory computer-readable storage medium having instructions stored therein, which when executed by a processor, cause the processor to perform operations for data protection management in a distributed storage system, the operations comprising:
 configuring a cluster of nodes into a plurality of k+m zones in which each zone manages data stored in the one or more data storage arrays, the data including k equal-sized primary backup chunks and one or more peer backup chunks of original data chunks replicated from different remote zones; and
 preparing the cluster of nodes for recovery from a failure of any one or more zones in the plurality of zones, including causing each zone in the plurality of zones to:
  encode the k equal-sized primary backup chunks to create in coding chunks using erasure coding,
  retain one of the m coding chunks in the zone,
  distribute each of the other m−1 coding chunks not retained to different zones in the plurality of zones, and
  delete any primary backup chunks from which coding chunks were created and any peer backup chunks from the zone to reduce storage overhead.

15. The non-transitory computer-readable storage medium of claim 14, the operations further comprising:
 detecting the failure of the any one or more zones in the plurality of zones; and
 recovering from the failure, including causing an unaffected zone unaffected by the failure to:
  retrieve from other unaffected zones any of still available coding chunks,
  create local copies of any of the still available original data chunks, from which the still available coding chunks were created and
  reconstruct any unavailable chunks from the still available coding chunks and the still available original data chunks.

16. The non-transitory computer-readable storage medium of claim 14, wherein the erasure coding used to encode the primary backup chunks to create coding chunks is bit matrix erasure coding.

17. The non-transitory computer-readable storage medium of claim 14, wherein:
 the plurality of zones into which the cluster is configured is at least k+m zones;
 the any one or more zones in the plurality of the at least k+m zones from which the cluster of nodes can recover is from 1 to m zones of the plurality of the at least k+m zones; and
 the erasure coding used to encode primary backup chunks to create coding chunks is a bit matrix encoding function having parameters k+m, in which k primary backup chunks are encoded to create m coding chunks.

18. The non-transitory computer-readable storage medium of claim 14, each of the m coding chunks are equal-sized and belong to a set of blocks of data stored in a partitioned disk space.

19. The non-transitory computer-readable storage medium of claim 14, wherein an index layer maps one or more file-names to data stored within the distributed data storage system, and wherein the index layer is to manage secondary indices used to manage the data stored on the distributed data storage.

* * * * *